United States Patent [19]

Schneider

[11] Patent Number: 4,678,999
[45] Date of Patent: Jul. 7, 1987

[54] CHARGE DEPLETION METER

[75] Inventor: Josef F. Schneider, Albuquerque, N. Mex.

[73] Assignee: The United States of America as represented by the Secretary of the Air Force, Washington, D.C.

[21] Appl. No.: 675,174

[22] Filed: Nov. 27, 1984

[51] Int. Cl.⁴ .................................... G01N 27/46
[52] U.S. Cl. .................... 324/427; 340/636; 320/48
[58] Field of Search ............ 324/427, 426, 428; 320/48, 48 X; 340/636

[56] References Cited

U.S. PATENT DOCUMENTS

| | | | |
|---|---|---|---|
| 3,500,167 | 3/1970 | Applegate et al. | 320/14 |
| 3,805,157 | 4/1974 | Acks et al. | 324/141 |
| 3,823,367 | 7/1974 | Kaye et al. | 324/29.5 |
| 3,971,980 | 7/1976 | Jungfer et al. | 324/29.5 |
| 4,194,146 | 3/1980 | Patry et al. | 320/48 X |
| 4,264,861 | 4/1981 | Radu et al. | 324/142 |
| 4,328,490 | 5/1982 | Usuba et al. | 340/715 |
| 4,361,809 | 11/1982 | Bil et al. | 324/426 |
| 4,390,841 | 6/1983 | Martin et al. | 324/427 |

Primary Examiner—Reinhard J. Eisenzopf
Assistant Examiner—Robert W. Mueller
Attorney, Agent, or Firm—William Stepanishen; Donald J. Singer

[57] ABSTRACT

A charge depletion meter apparatus having a current to frequency converter to sense and convert the current drain of a battery source to a digital signal which is divided and then accumulated in a counter. An LCD display unit displays the accumulated charge which is received from the counter.

6 Claims, 3 Drawing Figures

CHARGE DEPLETION METER

STATEMENT OF GOVERNMENT INTEREST

The invention described herein may be manufactured and used by or for the Government for governmental purposes without the payment of any royalty thereon.

BACKGROUND OF THE INVENTION

The present invention relates broadly to battery capacity measurement apparatus and in particular to a charge depletion meter.

In the prior art one of the more reliable methods of determining the state of charge of lead-acid battery was the hydrometer test. Sulphuric acid which is commonly used in a lead-acid battery is heavier than water. Therefore, the mixture of sulphuric acid and water which is used as the electrolyte, is heavier than pure water and its specific gravity may be measured.

When a battery is fully charged, the electrolyte has a specific gravity reading of about 1.250 to 1.290. This reading means that the given amount of the electrolyte in the battery will weigh 1.25 to 1.29 times as much as the same volume of pure water. As the battery discharges, some of the heavier sulphuric acid is broken up and unites with the battery plates to form a lead sulphate coating on the plates. The remaining electrolyte, therefore, becomes lighter and lighter as the battery discharges. For this reason, it is possible to tell how much a battery has become discharged simply by measuring the specific gravity of the electrolyte.

The instrument which is used to measure the specific gravity of the electrolyte in a battery is the hydrometer. The hydrometer consists of a glass barrel with a small float inside. A hydrometer reading is taken by squeezing the rubber bulb at the top, inserting the hard rubber nozzle into one cell of the battery, and releasing the bulb to draw some of the electrolyte up into the barrel. When the electrolyte has risen to a convenient level for accurate reading, it is prevented from rising farther by a small tube. This method of measuring the state of charge of a battery is strictly manually and time-consuming. The present invention provides a completely automatic charge monitoring and measuring apparatus.

The charge depletion meter apparatus solves the problem of knowing exactly how much charge has been drained from a battery at any one time. Consequently, it is known how much charge is left in it and battery replacement can be handled on a more economic basis. Therefore, the charge depletion meter solves the problem of keeping track of consumption when a battery is frequently turned on and off or when widely varying loads are encountered.

SUMMARY OF THE INVENTION

The present invention utilizes a current to frequency converter unit to measure the current being drawn from a battery. The converter output is divided by a scale factor to display the battery charge consumption in one of three ampere-hour ranges in a continuous, digital decimal display.

It is one object of the present invention, therefore, to provide an improved charge depletion meter apparatus.

It is another object of the invention to provide an improved charge depletion meter apparatus which is a completely solid state ampere-hour measuring device configured to show in a continuous, digital decimal display the accumulated charge used by a device or taken from a source.

It is another object of the invention to provide an improved charge depletion meter apparatus which uses a current to frequency converter unit to measure the charge consumption by means of frequency dividers that provide total accumulation for display in a display counter.

It is another object of the invention to provide an improved charge depletion meter apparatus wherein even the minutest charge consumption is accumulated until a resolution unit is reached and displayed.

It is another object of the invention to provide an improved charge depletion meter apparatus wherein the converter and the divider units are remote to one another and are connected by a transmission line.

These and other advantages, objects and features of the invention will become more apparent after considering the following description taken in conjunction with the illustrative embodiment in the accompanying drawings.

DESCRIPTION OF THE PREFERRED EMBODIMENT

Figure 1:
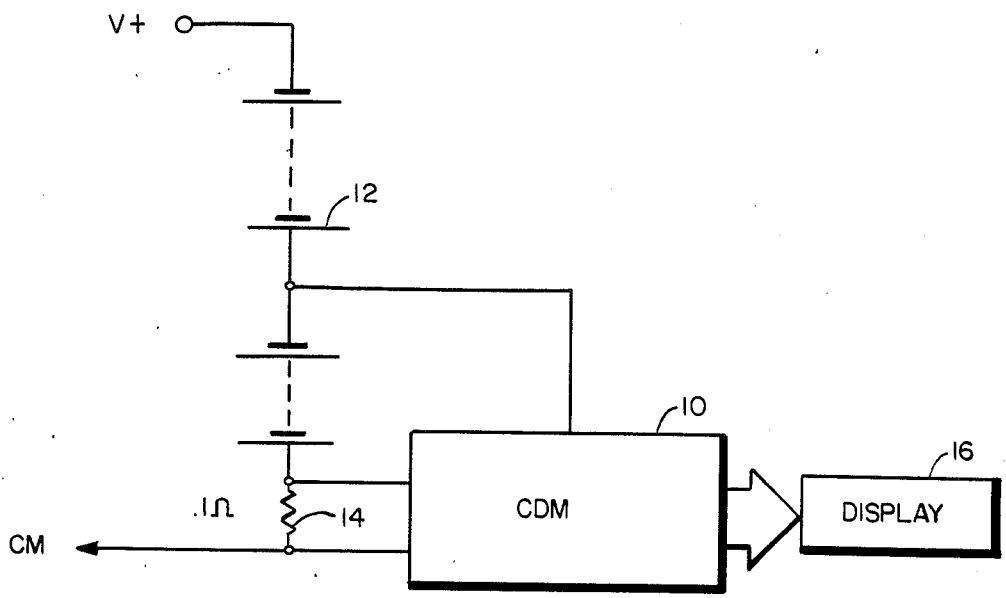
FIG. 1 is a block diagram, partially in schematic, of the charge depletion meter apparatus in its test configuration.

Referring now to FIG. 1 there is shown a charge depletion meter apparatus 10 connected to a battery source 12. A current sensing resistor 14 is connected in series with the battery source 12 and is connected across the input to the charge depletion meter apparatus 10. The charge depletion meter apparatus 10 derives its power for operation from the battery source 12. A display unit 16 is connected to the charge depletion meter apparatus 10 to display the charge use and state of the battery source 12.

The charge depletion meter is a completely solid state ampere-hour measuring device which is configured to show in a continuous, digital decimal display the accumulated charge used by a device or taken from a source. It is calibrated in units of ampere-hours and has a full scale of 20, 200, and 2000 Ah with a resolution of 0.001, 0.01, and 0.1 Ah, respectively, on a $4\frac{1}{2}$ digit display.

The current to be measured is sensed by a low ohm resistor (1, 0.1, 0.01 ohm) which provides approximately 1 ma at full scale into a current-to-frequency converter. This current is adjusted so that the full scale output of the converter reaches 11,378 pulses per second, for any full scale of 0.1, 1, or 10A at the sensing location.

The converter output is divided by a factor of 409,600 to advance the display by the resolution unit of 0.001, 0.01, 0.1 Ah every 1/100 of an hour at full scale. The divider chain and the $4\frac{1}{2}$ digit display counter can be reset to zero by means of a reset button. The use of CMOS circuitry assures low power consumption and operation over a 5 to 7 volt supply variation.

The charge depletion meter apparatus operates on a full scale reading of 1 A. The sensing resistor is inserted in the battery-common connection. The charge depletion meter apparatus (CDM) measures the current which is provided by this voltage drop and is powered by the same battery at a tiepoint if necessary to obtain proper voltage.

Figure 2:
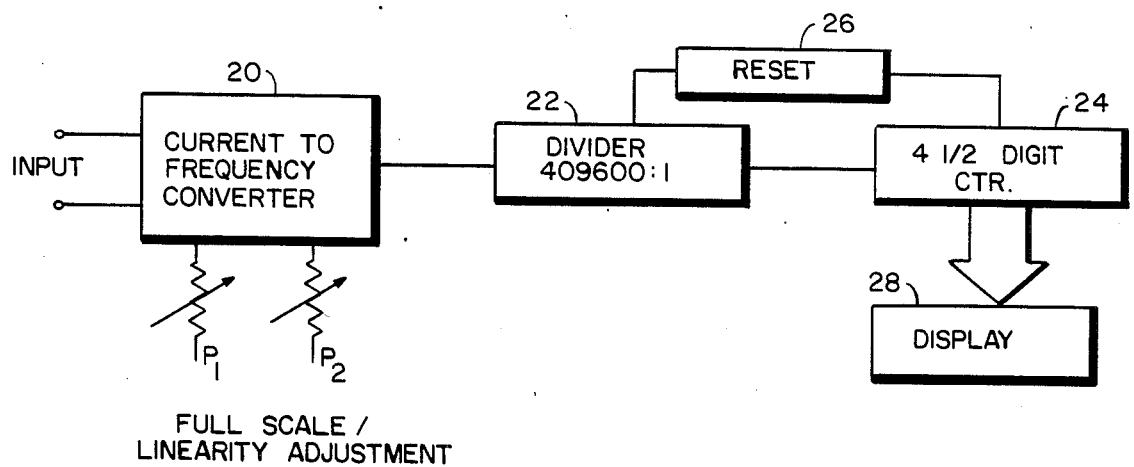
FIG. 2 is a block diagram of the charge depletion meter apparatus according to the present invention, and, FIG. 3 is a circuit diagram showing in greater detail the charge depletion meter apparatus.

Turning now to FIG. 2, there is shown a block diagram of the charge depletion meter apparatus wherein the current to frequency converter unit 20 is utilized to measure the current drain of a battery source under test (not shown). First and second potentiometers $P_1+P_2$ are provided to permit full scale and linearity adjustment of the current to frequency converter unit 20. The analog input signal to the current to frequency converter unit 20 is converted to a digital signal which is applied to the divider unit 22. The divider unit 22 divides down the digital signal by a predetermined number, such as 409,600 to 1. The output of the divider unit 22 is applied to the $4\frac{1}{2}$ digit counter unit 24 wherein the output pulses are accumulated. The results of the $4\frac{1}{2}$ digit counter unit 24 are displayed in display unit 28. A reset means 26 is coupled to both the divider unit 22 and the $4\frac{1}{2}$ digit counter unit 24 to permit the manual resetting of both units.

Figure 3:
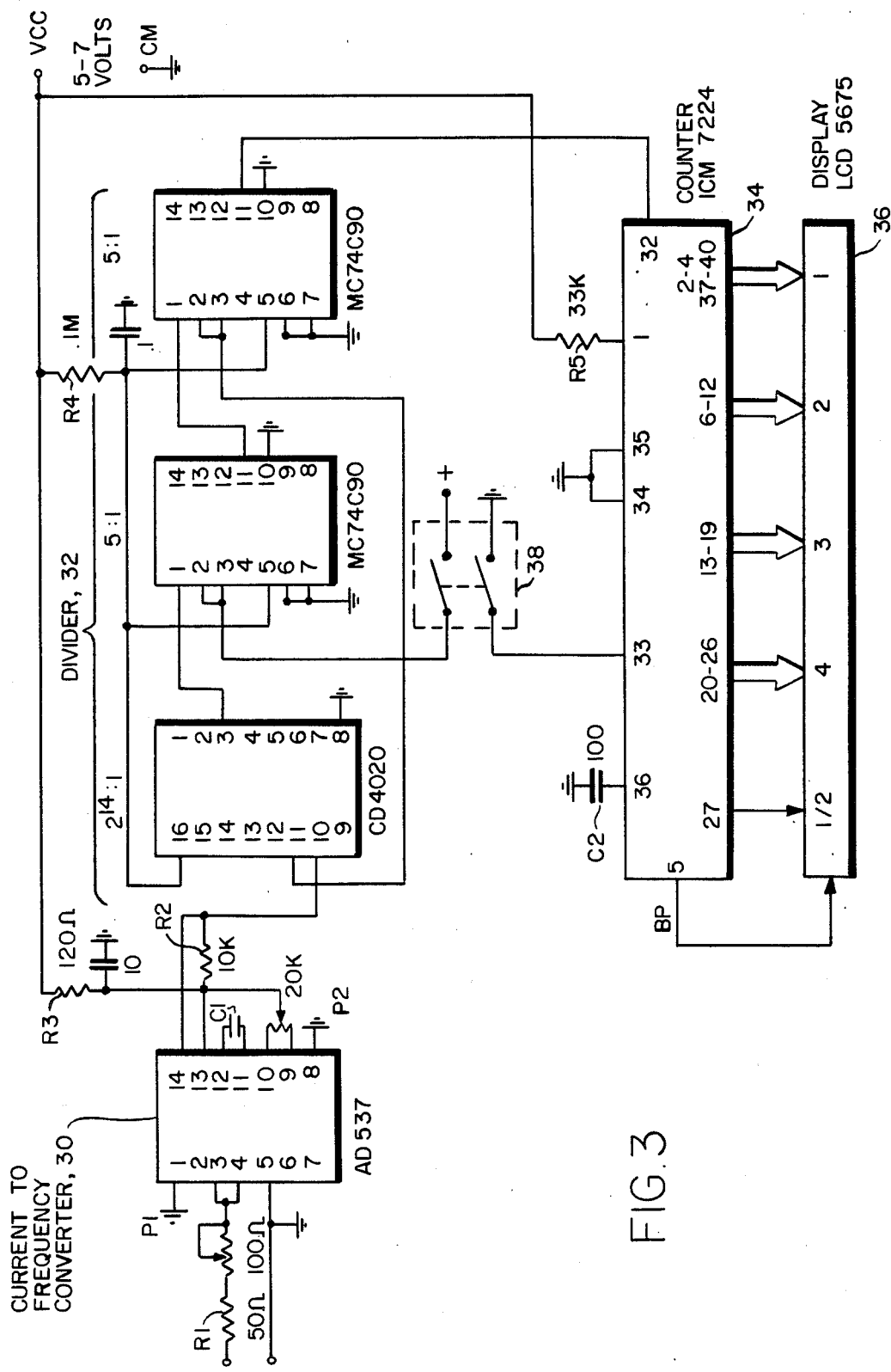

There is shown in FIG. 3 a circuit diagram of the charge depletion meter wherein the current to frequency converter unit 30 comprises the integrated circuit AD537. The divider unit 32 which receives the digital signal from the current to frequency converter unit 30, comprises three integrated circuits, CD 4020 and two MC 74C90 units respectively. The $4\frac{1}{2}$ digit counter unit 34 which accumulates the charge signal, comprises an integrated circuit counter ICM 7224. The display unit 36 comprises an LCD display unit LCD 5675. A reset button 38 is connected to permit both the divider unit 32 and the $4\frac{1}{2}$ digit counter unit 34 to be reset respectively both units to zero.

The input current is adjusted with potentiometer P1 to yield a frequency output 11,378 pulses per second, which represents the full-scale output of the converter unit 30 for a 100 mV drop on the sensing resistor. Linearity is adjusted with potentiometer P2 by correcting the offset of the converter unit 30. Capacitor C1 sets the basic frequency of the converter 30. The output pulses are divided first by a compact 16,384:1 divider (CD 4020) and then by two consecutive 5:1 dividers (MC 74C90) to yield a total division factor of 409,600:1.

The divider output pulses are accumulated in a $4\frac{1}{2}$ digit decimal counter unit 34 in units of 0.001, 0.01, 0.1 Ah respective to the use of a 1, 0.1, 0.01Ω sensing resistor. Charge depletion amounts which are below the resolution unit of the counter are still accumulated in the divider and therefore there is no threshold barrier. The LCD display unit 36 is driven by the counter module 34, which provides the LCD backplane frequency (BP). It is set to about 30 Hz by capacitor C2. The supply voltage (VCC) dropping resistors R3, R4, R5 decouple the individual integrated circuit units and provide proper operating range. A reset button 38 forces the divider and the counter to zero. The components of the divider and the counter are of the CMOS type with a total supply current of approximately 150 $\mu$A. The converter needs a supply current of approximately 1.5 ma. While the converter unit 30 can be turned off when the load is removed, the divider unit 32 and the counter unit 34 should stay on the battery all the time, thereby holding the accumulated measurement. The constant drain of 150 $\mu$A produces a count (=resolution unit) every 2.8 days. Even after four weeks, only 0.1 Ah have accumulated which is 0.05% referred to the display capacity of 200 Ah. If this cannot be tolerated, a CMOS oscillator can be switched in, in lieu of the converter unit to produce 1.7 pulses per second at the divider input, the equivalent of the converter output for 150 $\mu$A in order to keep the count accurate.

Further uses and modifications that are envisioned are:

a. the counter be counted down which would show the charge still left in a battery when started at the batteries' capacity;

b. the counter be counted up as well as down which could be used to measure both discharge and charge of a rechargable battery;

c. a low battery indicator be derived from a count comparison with a value preset for a particular battery;

d. the display be done in LED when power consumption is of no consequence;

e. the divider and the counterparts use non-volatile technology;

f. the meter be calibrated to read percent of full charge capacity;

g. a blinking colon or any other symbol in the display indicate that the meter is working;

h. the divider and counter have their own battery for operation and for continuous holding of the accumulated count;

i. the readout, especially with LED be normally turned off and only activated when needed;

j. the meter be used as a regular Ah-meter for all kind of circuits;

k. the meter be fitted with a rectifier to be used on AC power.

Although the invention has been described with reference to a particular embodiment, it will be understood to those skilled in the art that the invention is capable of a variety of alternative embodiments within the spirit and scope of the appended claims

What is claimed is:

1. A charge depletion meter apparatus comprising in combination:

a sensing means connected to a battery source to sense the amount of charge flowing therethrough, said sensing means providing a charge signal, a current to frequency converter means coupled to said sensing means to receive said charge signal therefrom, said current to frequency converter means converting said charge signal to a digital signal which is representative thereof, a divider means coupled to said current to frequency converter means to receive said digital signal therefrom, said divider means dividing said digital signal by a predetermined number, said divider means providing an output pulse signal, a decimal counter means coupled to said divider means to receive said output pulse signal, said decimal counter means accumulating said output pulse signal, reset means coupled respectively to said divider means and said decimal counter means for manually resetting both to zero, and, a display means coupled to said decimal counter means to receive said output pulse signal therefrom, said display means displaying said output pulse signal.

2. A charge depletion meter apparatus as described in claim 1 wherein said sensing means comprises a resistor.

3. A charge depletion meter apparatus as described in claim 2 wherein said predetermined number equals 409,600 to 1.

4. A charge depletion meter apparatus as described in claim 3 wherein said divider means comprises a first divider unit with a first predetermined division factor, and, a pair of second divider units in series with each other with a second predetermined division factor, said pair of second divider units connected in series with said first divider unit.

5. A charge depletion meter apparatus as described in claim 4 wherein said display means comprises a $4\frac{1}{2}$ digit LCD display unit.

6. A charge depletion meter apparatus as described in claim 4 wherein said first predetermined division factor equals $2^{14}$ to 1 and said second predetermined division factor equals 5 to 1.

* * * * *